(12) United States Patent
Wuister et al.

(10) Patent No.: US 7,677,877 B2
(45) Date of Patent: Mar. 16, 2010

(54) IMPRINT LITHOGRAPHY

(75) Inventors: Sander Frederik Wuister, Eindhoven (NL); Aleksey Yurievich Kolesnychenko, Helmond (NL); Johan Frederik Dijksman, Weert (NL); Yvonne Wendela Kruijt-Stegeman, Eindhoven (NL); Ivar Schram, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 444 days.

(21) Appl. No.: 11/592,335

(22) Filed: Nov. 3, 2006

(65) Prior Publication Data

US 2007/0104813 A1 May 10, 2007

Related U.S. Application Data

(60) Provisional application No. 60/733,209, filed on Nov. 4, 2005.

(51) Int. Cl.
*B29B 13/08* (2006.01)

(52) U.S. Cl. .................................. 425/174.4; 425/385

(58) Field of Classification Search ................. 425/385, 425/174.4
See application file for complete search history.

(56) References Cited

U.S. PATENT DOCUMENTS

| | | | |
|---|---|---|---|
| 5,219,934 A * | 6/1993 | Heger et al. | 525/66 |
| 5,629,398 A * | 5/1997 | Okamoto et al. | 526/281 |
| 6,334,960 B1 | 1/2002 | Willson et al. | 216/52 |
| 6,482,742 B1 | 11/2002 | Chou | 438/690 |
| 6,671,034 B1 | 12/2003 | Hatakeyama et al. | 355/67 |
| 6,743,740 B2 * | 6/2004 | Brask | 438/795 |
| 2002/0050220 A1 * | 5/2002 | Schueller et al. | 101/486 |
| 2002/0171047 A1 * | 11/2002 | Chan et al. | 250/492.1 |
| 2003/0071016 A1 * | 4/2003 | Shih et al. | 216/54 |
| 2003/0080472 A1 * | 5/2003 | Chou | 264/338 |
| 2004/0124566 A1 | 7/2004 | Sreenivasan et al. | 264/494 |
| 2005/0184436 A1 * | 8/2005 | Jeong et al. | 264/496 |

FOREIGN PATENT DOCUMENTS

| | | |
|---|---|---|
| JP | 2004-184480 | 7/2004 |
| WO | WO 03/099463 A2 | 12/2003 |
| WO | WO 03/099463 A3 | 12/2003 |
| WO | 2005/038523 A2 | 4/2005 |
| WO | 2005/078779 A1 | 8/2005 |
| WO | 2005/101466 A2 | 10/2005 |

OTHER PUBLICATIONS

Haisma, et al., "Mold-Assisten Nanolithography: A Process for Reliable Pattern Replication," American Vacuum Society, J. Vac. Sci. Technol. B (14)6, Nov./Dec. 1996.
Japanese Office Action mailed Oct. 20, 2009 in the corresponding Japanese Office Application No. 2006-300285.

* cited by examiner

*Primary Examiner*—Maria Veronica D Ewald
(74) *Attorney, Agent, or Firm*—Pillsbury Winthrop Shaw Pittman LLP

(57) ABSTRACT

A lithographic apparatus is disclosed that includes an imprint template and a radiation source configured to cure photosensitive material, the radiation source including a laser or a light emitting diode. An imprint template is also disclosed.

11 Claims, 8 Drawing Sheets

IMPRINT LITHOGRAPHY

CROSS REFERENCE TO RELATED APPLICATIONS

This application claims the benefit of U.S. Provisional Patent Application No. 60/733,209, filed on Nov. 4, 2005, which application is hereby incorporated in its entirety by reference.

FIELD

The present invention relates to imprint lithography, e.g. to templates and radiation sources for use in imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such reductions. Current systems are starting to, adopt optical sources with wavelengths in the 193 nm regime but even at this level, diffraction limitations become a barrier. Optical lithography machines capable of enhanced resolutions typically require complex optics, rare materials, and/or cumbersome techniques and are consequently rather expensive.

An alternative for printing small features comprises transferring a pattern to a substrate by imprinting a pattern into an imprintable medium using a physical mould or template, and is also known as imprint lithography. The imprintable medium may be the substrate or a material coated onto a surface of the substrate. The imprintable medium may be functional or may be used as a "mask" to transfer a pattern to an underlying surface. The imprintable medium may for instance be provided as a resist deposited on a substrate such as a semiconductor material to which the pattern defined by the template is to be transferred. In imprint lithography the topography of a template thus largely defines the patterns created on a substrate.

In so-called UV imprint lithography, the imprintable medium may be cured by irradiating the medium with radiation that has passed through the template. Due to its transparency to radiation, and also because of its hardness, the template in UV imprint is often made of quartz. A disadvantage of quartz templates, however, is their cumbersome manufacture and replication.

SUMMARY

In an embodiment, there is provided an imprint template comprising a polymeric surface having a pattern with sub-200 nm resolution, the polymeric surface being a crosslinked polymeric surface.

In an embodiment, there is provided an imprint template comprising a surface having a pattern with sub-200 nm resolution, the surface being a polymeric surface with monomers grafted thereon.

In an embodiment, there is provided a lithographic apparatus comprising an imprint template and a radiation source configured to cure photosensitive material, the radiation source including a laser or a light emitting diode.

In an embodiment, there is provided a method, comprising pressing an imprint template into a resist layer provided on a substrate, and curing the imprinted resist layer with radiation from a laser or a light emitting diode.

In an embodiment, there is provided a template having a patterned surface suitable for use in UV imprint lithography, wherein the patterned surface is a polymeric surface.

In an embodiment, there is provided an imprint template comprising a polymeric surface having a pattern with sub-200 nm resolution, the polymeric surface being absent elastomers and rubbers.

In an embodiment, there is provided a process comprising:
contacting a surface of a substrate with a first template;
removing the first template from the surface;
optionally, coating the surface with a planarization layer;
providing resist on at least part of the substrate or the planarization layer;
patterning the resist with a second template; and
curing the resist.

In an embodiment, there is provided is a process comprising:
optionally, coating a substrate with a planarization layer;
coating a target portion of the substrate or the planarization layer with resist;
patterning the resist with a template having a polymeric surface, the polymeric surface comprising material having a Shore D hardness of at least 50 and/or an elongation at break of at most 150%; and
curing the target portion by exposing it to radiation, the radiation having passed through the polymeric surface prior to reaching the target portion.

In an embodiment, there are provided products prepared with the above apparatus and methods.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The present invention relates to imprint lithography. Examples of imprint lithography include, e.g., soft imprint, hot embossing, and UV imprint lithography. Schematic examples of each of these techniques are provided in FIGS. 1(a)-(c).

Figure 1A:
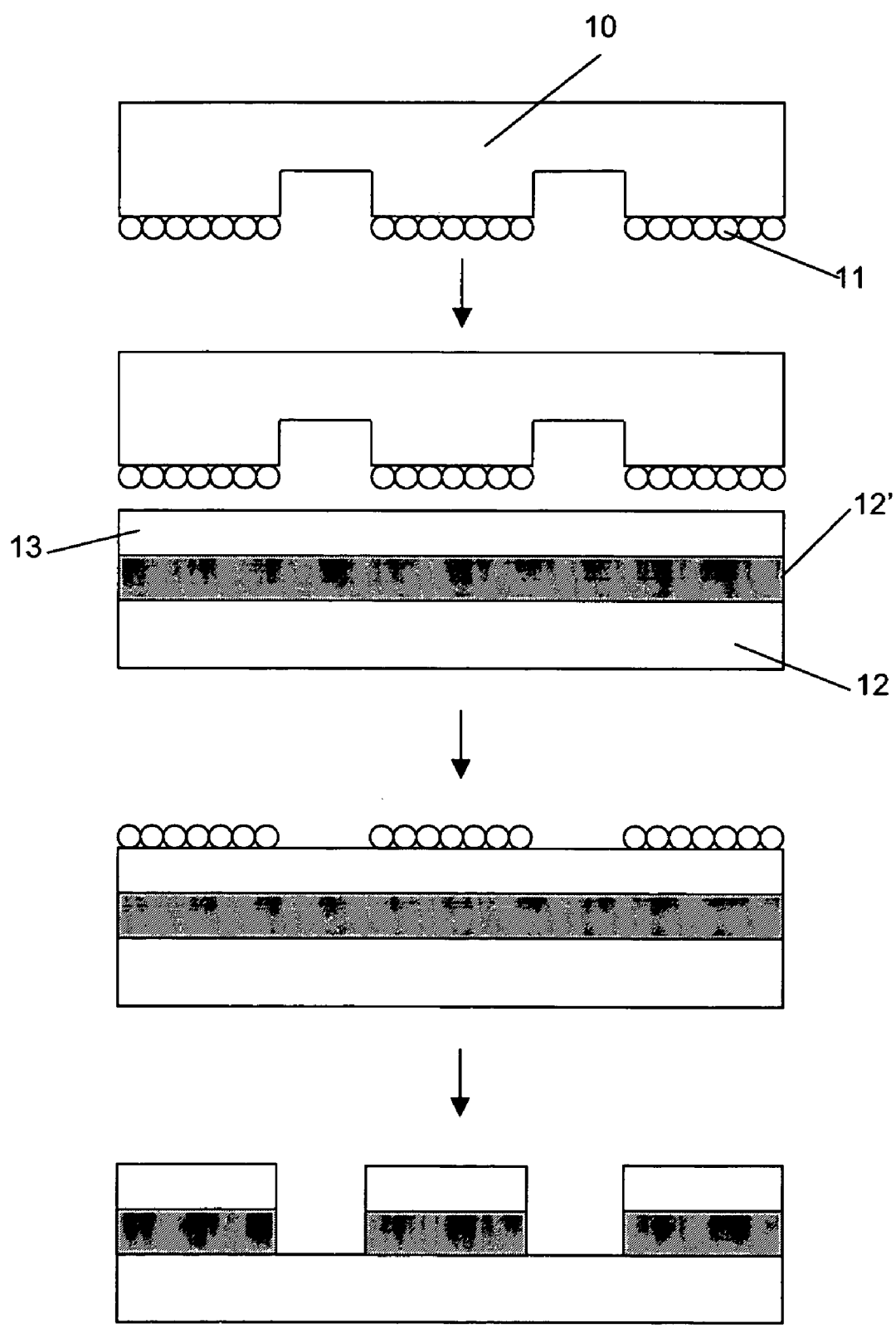
FIGS. 1a-1c schematically illustrates an example of a UV imprint lithography process.

FIG. 1a shows an example of a soft imprint lithography process which involves transferring a layer of molecules 11

(e.g. an ink such as a thiol) from a flexible template 10 (e.g. fabricated from polydimethylsiloxane (PDMS)) onto a resist layer 13 which is supported upon a substrate 12 and planarisation and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 remain on the resist and the residual layer of resist is etched such that the areas of the resist not covered by the transferred molecular layer are etched down to the substrate. See also, e.g., PCT Patent Application Publication No. WO 03/099463.

Figure 1B:
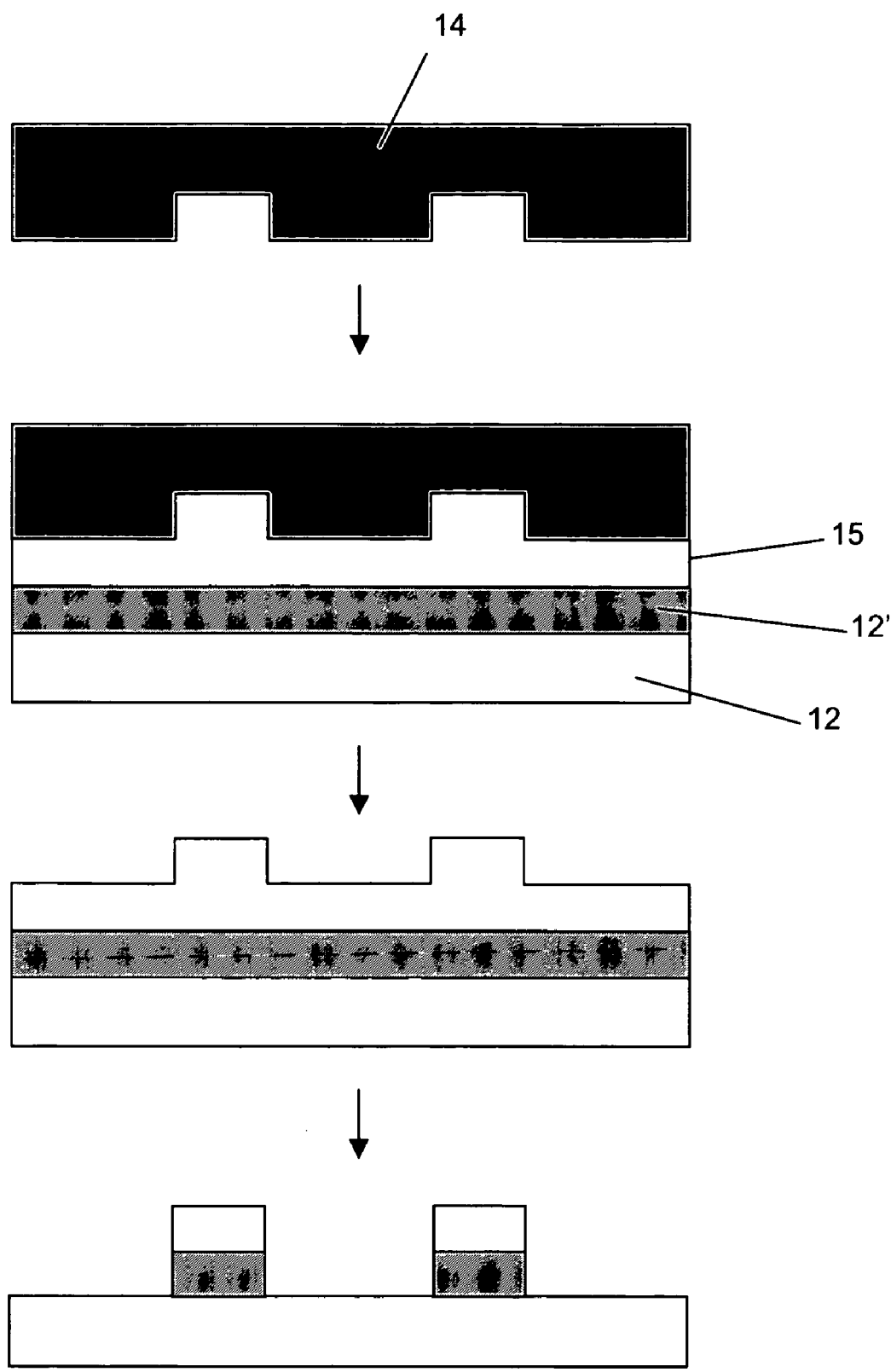

Hot imprint lithography (or hot embossing) generally uses harder templates made from, for example, silicon or nickel, which are generally more resistant to wear and deformation than, e.g., PDMS. See also U.S. Pat. No. 6,482,742. Referring to FIG. 1b, a solid template 14 is imprinted into a thermosetting or a thermoplastic polymer resin 15, which has been cast on the surface of a substrate 12. The resin may for instance be spin coated and baked onto the substrate surface or more typically (as in the example illustrated) onto a planarisation and transfer layer 12'.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies having the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated to above the glass transition temperature of the resin to soften the resin. The template is pressed into the softened resin and sufficient pressure is applied to ensure the resin flows into the pattern features defined on the template. The resin is then cooled to below its glass transition temperature with the template in place whereupon the resin hardens having the desired pattern. The pattern consists of the features in relief from a residual layer of the resin which may then be removed by an appropriate etch process to leave only the pattern features.

Figure 1C:
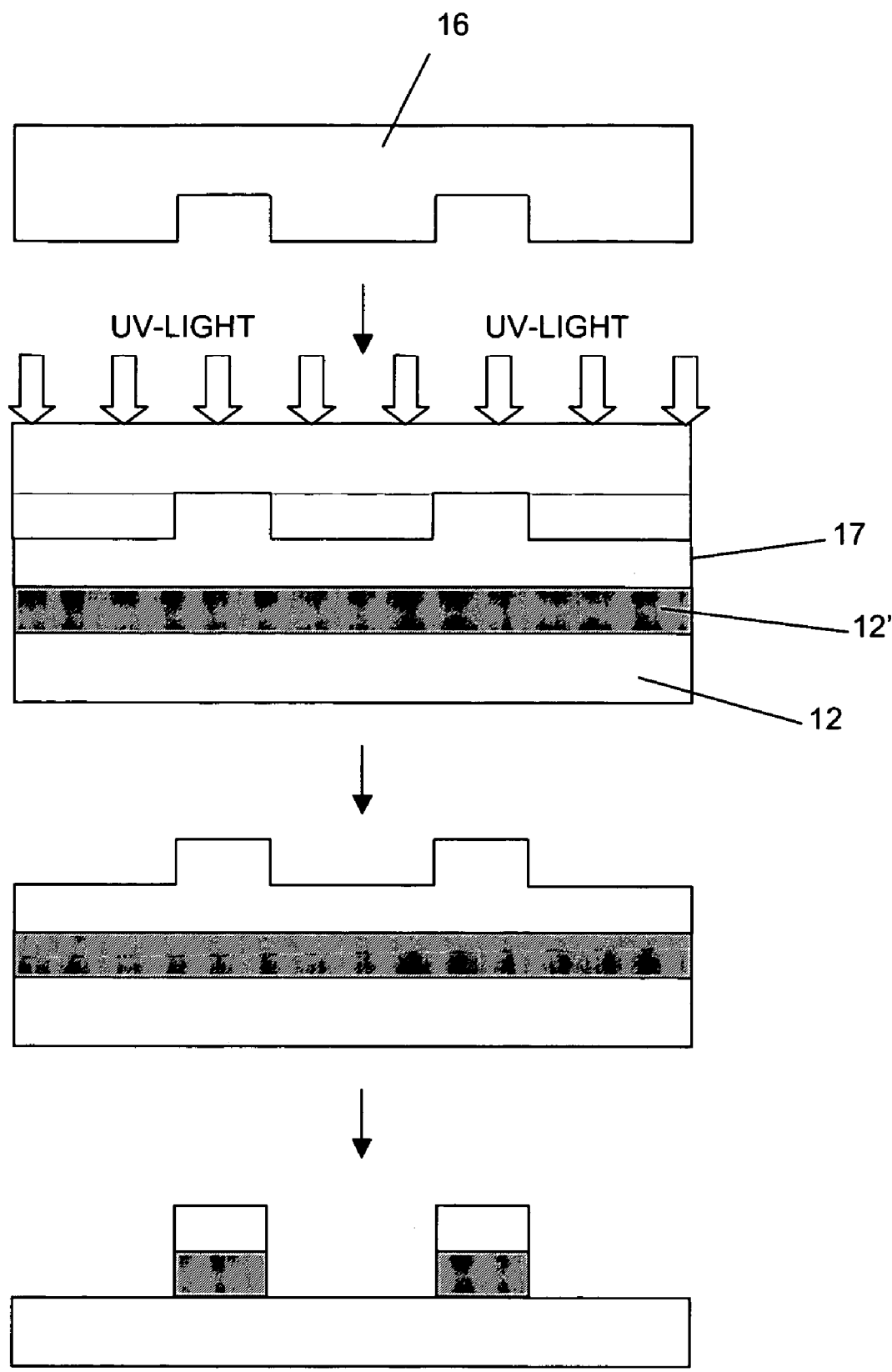

An example of a UV imprint process is illustrated in FIG. 1c. A template 16 is applied to a UV-curable resin 17. UV radiation is applied to the resin through the template in order to cure it. A particular type of UV imprint technology is step and flash imprint lithography (SFIL), which may be used to pattern a substrate in small steps in a similar manner to optical steppers conventionally used in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may assist in minimizing pattern distortions and critical dimension (CD) variations so that SFIL may be particularly suited to manufacture of integrated circuits and other devices requiring relatively high overlay accuracy. See also, e.g., U.S. Pat. No. 6,334,960; U.S. Published Patent Application No. 2004-0124566; and the article "Mold-assisted nanolithography: A process for reliable pattern replication" by J. Haisma in J. Vac. Sci. Technol. B 14(6), November/December 1996.

Figure 2:
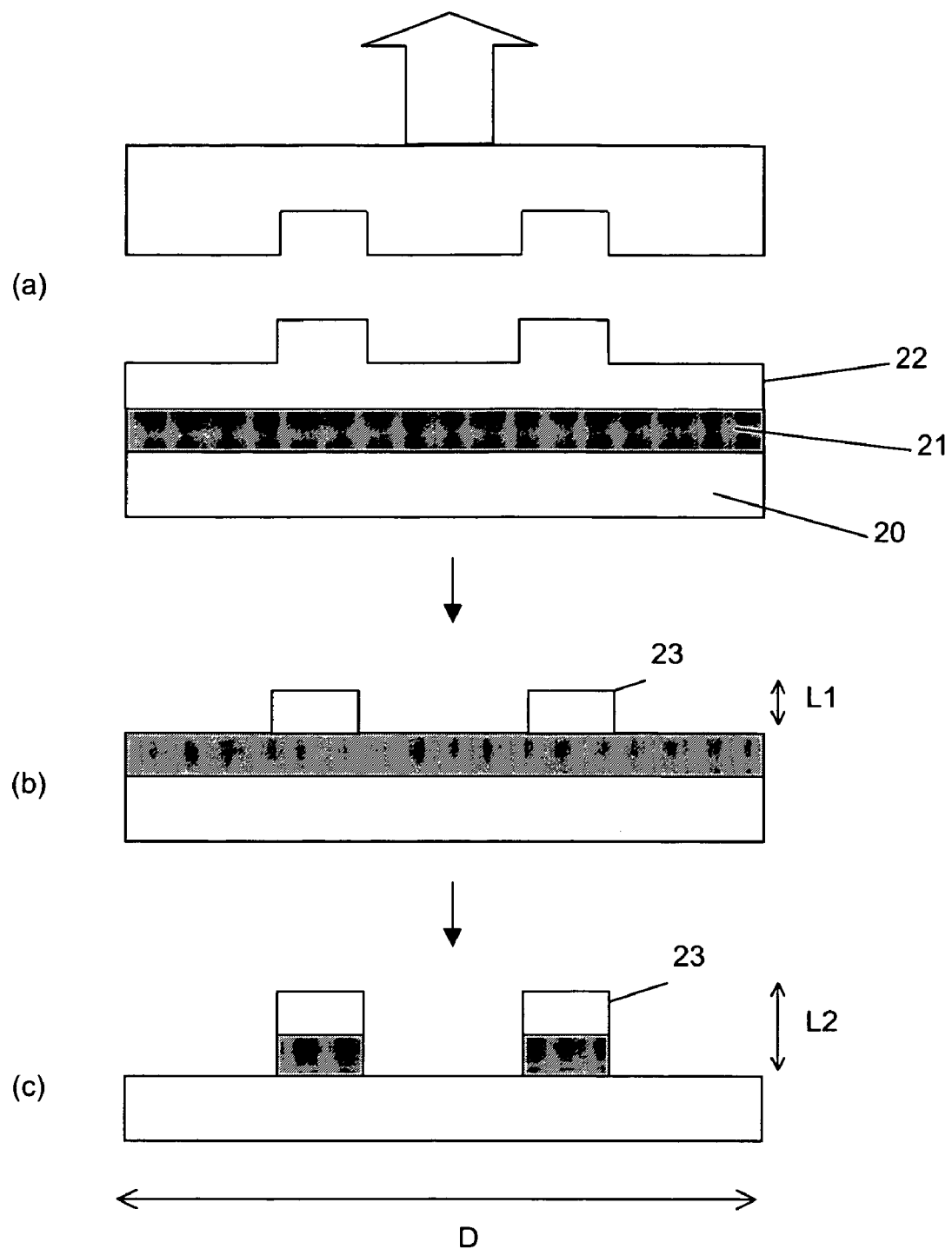
FIG. 2 schematically illustrates an example of a two step etching process.

Upon removal of the template from the solidified resin, a two-step etching process may be performed as illustrated in FIGS. 2a to 2c. The substrate 20 has a planarisation and transfer layer 21 immediately upon it, as shown in FIG. 2a. The purpose of the planarisation and transfer layer is twofold. It acts to provide a surface parallel to that of the template, which assists in providing parallel contact between the template and the resin, and also in improving the aspect ratio of the printed features.

After the template has been removed, a residual layer 22 of the solidified resin is left on the planarisation and transfer layer 21, shaped in the desired pattern. The first etch is isotropic (non-selective) and removes parts of the residual layer, resulting in a relatively poor aspect ratio of features where L1 is the height of the features 23, as shown in FIG. 2b. The second etch is anisotropic (or selective) and improves the aspect ratio. The anisotropic etch removes those parts of the planarisation and transfer layer which are not covered by the solidified resin, increasing the aspect ratio of the features 23 to (L2/D), as shown in FIG. 2c. The resulting polymer thickness contrast left on the substrate after etching can be used as, for instance, a mask for dry etching if the imprinted polymer is sufficiently resistant, for instance as a step in a lift-off process.

As an alternative to imprint systems using a planar template which is maintained substantially parallel to the substrate surface, roller imprint systems may be used. These systems concern situations where the template is formed on a roller. Other than the rolling template, the general imprint process is largely similar to imprinting using a planar template. Unless the context requires otherwise, references to an imprint template include references to a roller template.

As to application of resin onto a substrate, the resin can be applied to the entire substrate surface by, for instance, spin coating. Also, the resin may be supplied on the template surface in lieu of, or in addition to, the substrate surface. Furthermore, the resin may be supplied section-by-section. Applying the resin section-by-section may be beneficial for instance in situations where the entire substrate is not imprinted in a single step, e.g. in step-and-flash imprint litho, to minimize evaporation of the resin prior to the imprinting. One approach is a 'drop on demand' process in which the resin is dispensed onto a target portion of the substrate in droplets, e.g. via inkjet deposition, immediately prior to imprinting with the template. The liquid dispensing is controlled so that a certain volume of liquid is deposited on a particular target portion of the substrate. The liquid may be dispensed in a variety of patterns and the combination of controlling liquid volume and placement of the pattern can be employed to confine patterning to the target area. Inkjet deposition may be a used to facilitate controlling liquid volume and placement of the pattern.

While in the description above particular reference has been made to the use of imprint lithography to transfer a template pattern to a substrate via an imprintable resin effectively acting as a resist, in an embodiment the imprintable material may itself be a functional material, for instance having a functionality such as conductivity, optical linear or non linear response, etc. For example, the functional material may form a conductive layer, a semiconductive layer, a dielectric layer or a layer having another desirable mechanical, electrical, photonic or optical property. Some organic substances may also be appropriate functional materials.

Figure 3:
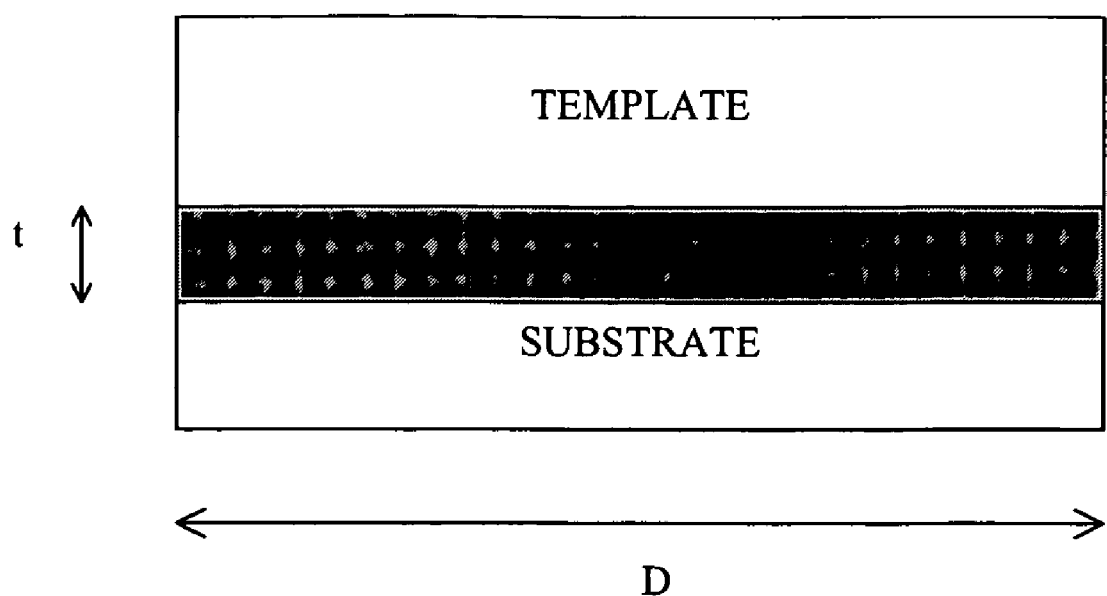
FIG. 3 schematically illustrates an example of a template and an imprintable resist layer deposited on a substrate.

FIG. 3 illustrates an example of relative dimensions of a template, imprintable material (curable monomer, thermosetting resin, thermoplastic, etc.) and substrate. In an embodiment, the ratio of the width of the substrate, D, to the thickness of the curable resin layer, t, may be, e.g., of the order of $10^6$. In an embodiment, e.g. to avoid the features projecting from the template damaging the substrate, the dimension t is greater than the depth of the projecting features on the template. In an embodiment, the substrate is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. In an embodiment, the substrate is a plastic substrate.

As noted, the resolution of the features on the template surface can be a limiting factor on the attainable resolution of features printed on the substrate. In UV imprint lithography, templates are generally made of quartz. Quartz has the benefit of being a hard, transparent material. Such a template is generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used.

As will be evident from the preceding paragraph, the manufacture of templates such as quartz templates is rather complex and costly. If replication of the template would be relatively easy once an original has been made, the complexity and costs of manufacturing the original might be offset to an extent. Duplicating a quartz template, however, generally comes down to having to manufacture a second original.

In an embodiment of the invention, there is provided an imprint template having a polymeric surface comprising the pattern to be imprinted. In an embodiment, the resolution of the pattern is less than 1 micron (i.e. the pattern comprises lines with a width that are less than 1 micron), e.g. less than 700 nm, less than 500 nm, less than 300 nm, less than 200 nm, less than 100 nm, less than 60 nm, or less than 30 nm. In an embodiment, the resolution is at least 2 nm, e.g. at least 4 nm, at least 7 nm, or at least 10 nm.

In an embodiment, the template is prepared by a molding process, e.g. injection molding, using a conventional template (e.g. a quartz template) as the mold. In another embodiment, the template is prepared through embossing using, e.g., a conventional template.

In an embodiment, the polymeric surface comprises a polymer selected from the group consisting of polymethylmethacrylate (PMMA), cyclic olefin polymer (COP), cyclic olefin copolymer (COC), polycarbonate, and polystyrene (including hydrogenated polystyrene). An example of cyclic olefin copolymer is, for instance, the copolymer of 2-norbornene ethylene. Examples of commercial tradenames include, e.g., ACRYLITE OP4 (PMMA), ZEONOR (COP), ZEONEX (COP), and TOPAS (COC).

Compared to for instance quartz, many polymers are poorly transparent to UV radiation and/or have only a fairly narrow bandwith in which they are transparent. Accordingly, the commonly used mercury lamp in UV imprint lithography may not always be suitable or preferred when employing a template with a polymeric imprint surface. In an embodiment of the invention, there is provided an imprint lithography apparatus equipped with one or more light emitting diodes (LEDs) and/or one or more lasers (e.g. laser diodes or excimer lasers) as the radiation source to cure the imprintable medium (e.g., resist). Features of LEDs include, e.g., that they can be wavelength specific, are available in many emission energies (e.g. spanning a range from the infrared to the UV), can offer short (e.g. nanosecond) pulses, and/or can provide relatively high emission powers (e.g. exceeding 1 W/cm$^2$).

Figure 4:
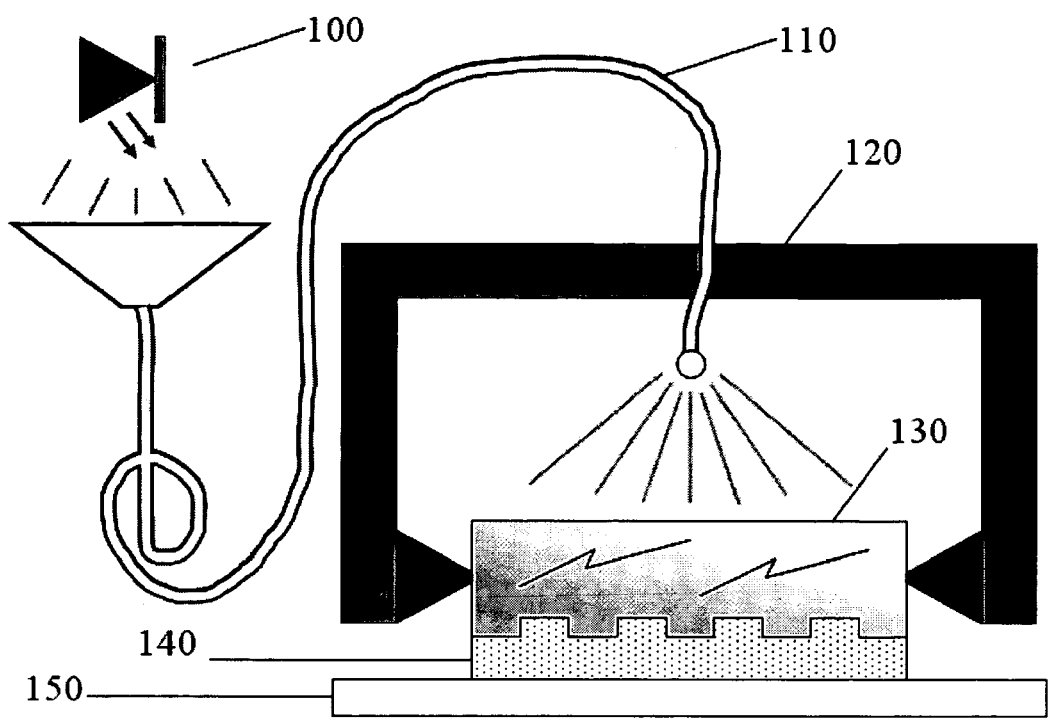
FIG. 4 schematically represents an example of a template holder and a radiation source according to an embodiment of the invention.

FIG. 4 depicts an embodiment of the use of a light emitting diode as radiation source (LED). Template 130 is held by template holder 120 and pressed in resist layer 140, which is provided on substrate 150. Radiation from LED 100 is guided by optical fiber 110 to the template holder, and the resist layer 140 is cured by the radiation that passes through template 130.

Figure 5:
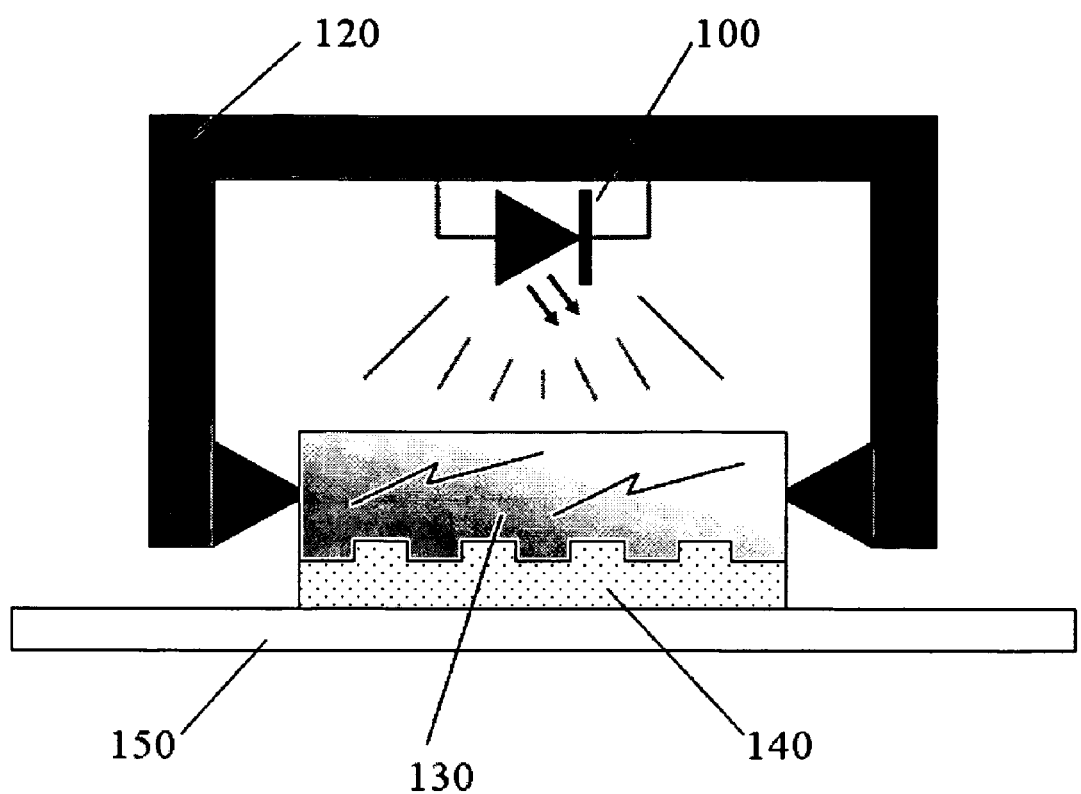
FIG. 5 schematically represents an example of a template holder with a radiation source according to an embodiment of the invention.

FIG. 5 depicts another embodiment of the use of a LED as radiation source. Here, the LED 100 is not remote from the template holder but instead the template holder comprises the LED 100. In an embodiment, referring to FIG. 6, the template holder further comprises one or more lenses to collimate the radiation from the LED 100. Providing one or more collimating lenses may assist in avoiding stray light.

Figure 6:
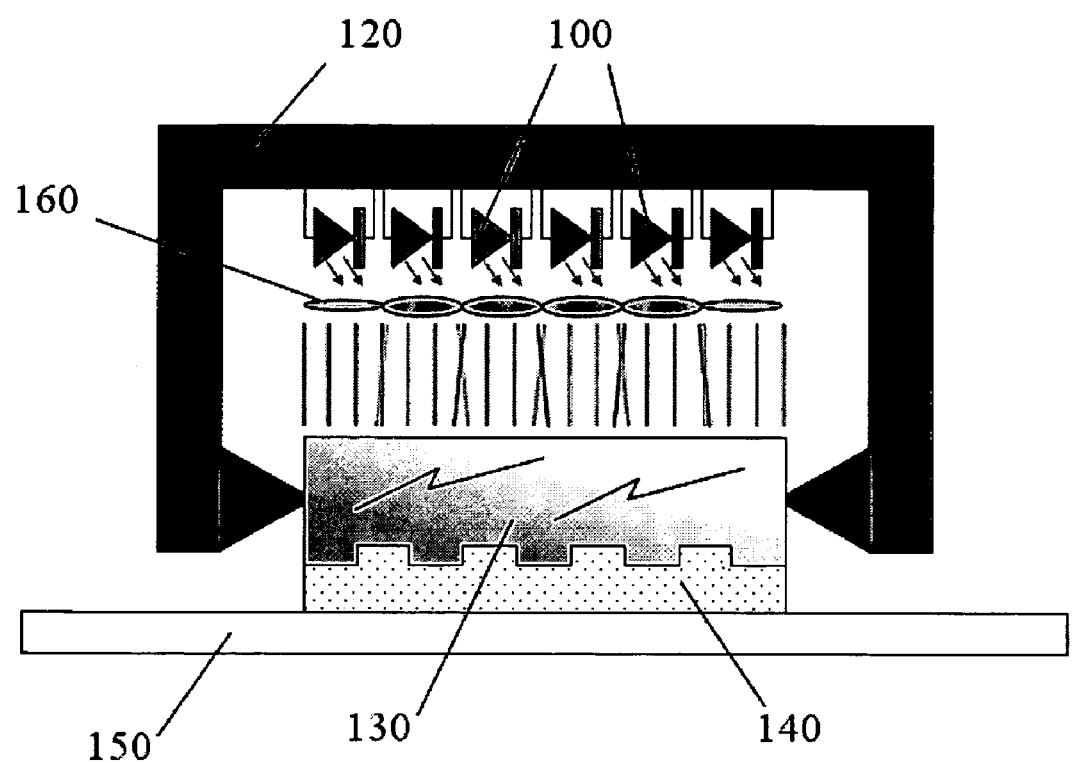
FIG. 6 schematically represents an example of a template holder with a radiation source according to an embodiment of the invention.

FIG. 6 depicts an embodiment where the template holder 120 comprises an array of LEDs 100. In an embodiment, the LEDs are similar and provide radiation of the same wavelengths. In an embodiment, the array of LEDs comprises LEDs emitting different wavelengths. Having an array of LEDs with different wavelengths may be helpful in tuning the radiation to the template and/or resist being used. The template holder 120 also comprises a lens array 160 to collimate the light.

In an embodiment, the imprint lithography apparatus comprises a plurality of templates. In an embodiment, the imprint lithography apparatus comprises a plurality of template holders.

In an embodiment, the radiation source comprises a semiconductor material, such as gallium nitride, indium gallium nitride, or aluminum gallium nitride. In an embodiment, the radiation source comprises xenon chloride or xenon fluoride. In an embodiment, the radiation source comprises neodymium ions, e.g. in a grid of yttrium aluminum garnet. In an embodiment, the radiation source provides actinic radiation. In an embodiment, the radiation source provides radiation with a wavelength in the range of 190-500 nm, e.g. 250-425 nm or 300-410 nm. It will be appreciated that although this application refers regularly to "UV imprint lithography", in fact any form of radiation suitable to cure the imprintable medium may be used and the term "UV" in this context, unless explicitly noted otherwise, is therefore not limited to typical UV wavelengths of radiation.

The choice of wavelength and emission power may to an extent steer the type and concentration of photoinitiator used in the resist. Examples of photoinitiators that may be used include, e.g., LUCIRIN TPO (comprising 2,4,6-Trimethyl-benzoyldiphenylphosphine oxide), IRGACURE 784 (comprising Bis (eta 5-2,4-cyclopentadien-1-yl) Bis [2,6-difluoro-3-(1H-pyrrol-1-yl) phenyl]titanium), and IRGACUR 819 (comprising Phosphine oxide, phenyl bis (2,4,6-trimethyl benzoyl)).

In an embodiment, the polymeric surface is a crosslinked surface. Crosslinking may assist in providing the polymeric surface with increased hardness. Methods of providing a crosslinked surface may vary. In an embodiment, for instance, the polymeric surface is a thermoplastic surface and crosslinking is effected by exposing the surface to gamma radiation. In another embodiment, the crosslinking is provided through reaction injection molding (RIM), wherein a crosslinkable resin is injected against a mold (e.g. a conventional template) and crosslinked in-situ (e.g. by providing heat). Reaction injection molding has the benefit that the initially injected component (i.e. the resin before crosslinking) has a relatively low viscosity which facilitates penetration into the pattern of the mold. In another embodiment, a thin layer (e.g. less than 100 micron, such as less than 50 micron, less than 25 micron, less than 10 micron, or less than 5 micron) of crosslinkable resin (e.g. styrene/divinyl benzene resin, a polyacrylate resin, an epoxy resin, an acrylate/epoxy resin, etc.) is provided on the mold (e.g. conventional template) before injection molding with, e.g., a thermoplast. Curing the thin layer followed by the injection molding may provide a relatively hard protective layer on the thermoplast.

In an embodiment, the polymeric surface of the template comprises, e.g. consists essentially of, material having a Shore D hardness (ASTM D2240) of at least 50 (for instance a Shore D hardness of at least 60, at least 70, at least 80, or a Rockwell R hardness (ASTM D785) of at least 100, at least 110, or at least 120).

In an embodiment, the polymeric surface of the template comprises, e.g. consists essentially of, material having an elongation to break (ASTM D638) of at most 200%, e.g. at most 150%, at most 100%, at most 75%, at most 50%, at most 25%, at most 10%, or at most 5%.

In an embodiment, the area of the template comprising the pattern to be imprinted is essentially absent quartz, nickel, silicon, and/or polydimethylsiloxane. In an embodiment, the area of the template comprising the pattern to be imprinted is essentially absent elastomers and rubbers.

In an embodiment, the template includes (i) a polymeric layer comprising the pattern to be imprinted and (ii) a ceramic, e.g. quartz, body on which the polymeric layer is provided.

In an embodiment, the polymeric surface is functionalized, e.g. by grafting molecules on the surface. As to the art of grafting molecules on polymer surfaces, see e.g. the article of Rohr et al. entitled "Surface Functionalization of Thermoplastic Polymers for the Fabrication of Microfluidic Devices by Photoinitiated Grafting" in Advanced Functional Materials, 2003, 13, No. 4, pages 264-270. The molecules grafted on the polymeric surface may, e.g., improve the anti-sticking properties of the surface. In an embodiment, the polymeric surface is functionalized with olefinic and/or halogenated molecules, e.g. alkyl monomers or fluorinated alkyl monomers such as C4-C30 alkylacrylates or fluorinated C4-C30 alkylacrylates. Specific examples include, e.g., fluorinated alkylchlorosilane (e.g. $CF_3(CF_2)_6(CH_2)_2SiCl_3$, 2,2,3,3,4,4,4,-heptafluorobutyl acrylate, perfluorooctyl acrylate, butyl acrylate, octyl acrylate, lauryl acrylate, or stearyl acrylate.

Furthermore, there is provided a process comprising:
coating a substrate with a layer of resist;
pressing in a target portion of the resist a template having a polymeric surface, the polymeric surface comprising material having a Shore D hardness of at least 50 and/or an elongation at break of at most 150%; and
curing the resist by exposing the layer of resist to radiation, the radiation having passed through the polymeric surface prior to reaching the resist.

In an embodiment, there is provided a process comprising:
contacting a surface of a substrate with a first template;
removing the first template from the surface;
optionally, coating the surface with a planarization layer;
providing resist on at least part of the substrate or the planarization layer;
patterning the resist with a second template; and
curing the resist.

In an embodiment, the first template has an affinity for dust and the contact with (and subsequent removal of) the first template with the substrate thus acts as a cleaning procedure for the surface of the substrate. This may, e.g., assist in avoiding damage to the pattern of the second template by any dust particles.

The present apparatus, templates, and processes may be used in a wide variety of applications. For instance, in an embodiment, the present apparatus, templates and/or processes may be used, e.g., in the manufacture of ICs. In an embodiment, the present apparatus, templates and/or processes may be used, e.g., in the manufacture of magnetic storage media. In an embodiment, the present apparatus, templates and/or processes may be used, e.g., in the manufacture of thin-film magnetic heads. In an embodiment, the present apparatus, templates and/or processes may be used, e.g., in the manufacture of integrated optical systems. In an embodiment, the present apparatus, templates and/or processes may be used, e.g., in the manufacture of photonics. In an embodiment, the present apparatus, templates and/or processes may be used, e.g., in the manufacture of guidance and detection patterns for magnetic domain memories. In an embodiment, the present apparatus, templates and/or processes may be used, e.g., in the manufacture of liquid crystal displays. In an embodiment, the present apparatus, templates and/or processes may be used, e.g., in the manufacture of biomedical devices, e.g. DNA chips. In an embodiment, the present apparatus, templates, and/or processes may be used, e.g., in the manufacture of micro-electromechanical devices (MEMS).

Having described specific embodiments of the invention, it will be understood that many modifications thereof will readily be apparent to those skilled in the art, and it is intended therefore that this invention is limited only by the spirit and scope of the following claims.

The invention claimed is:

1. A lithographic apparatus, comprising:
an imprint template;
a radiation source configured to cure photosensitive material, wherein the radiation source includes a light emitting diode, and
a holder from the template, the holder being provided with the light emitting diode.

2. The apparatus of claim 1, wherein the imprint template is at least partially transparent to radiation provided by the radiation source.

3. The apparatus of claim 1, wherein the imprint template is substantially transparent to radiation provided by the radiation source.

4. A lithographic apparatus comprising:
an imprint template;
a radiation source configured to cure photosensitive material, wherein the radiation source includes a light emitting diode, and
an optical fiber to optically connect the light emitting diode and the template.

5. The apparatus of claim 1, wherein the apparatus comprises a plurality of templates.

6. The apparatus of claim 1, wherein the template has a polymeric surface with sub-200 nm structures.

7. A lithographic apparatus, comprising:
an imprint template; and
a radiation source configured to cure photosensitive material, wherein the imprint template includes a polymeric surface comprising the pattern to be imprinted and wherein monomers are grafted on the polymeric surface.

8. The apparatus of claim 7, wherein the monomers include halogenated monomers.

9. The apparatus of claim 7, wherein the monomers include monomers comprising a C6-C30 alkyl chain.

10. The apparatus of claim 6, wherein the polymeric surface comprises cyclic olefin polymer, cyclic olefin copolymer, polycarbonate, or polymethylmethacrylate.

11. The apparatus of claim 6, wherein the polymeric surface comprises cyclic olefin polymer or cyclic olefin copolymer.

* * * * *